United States Patent
Baree et al.

(10) Patent No.: US 7,304,541 B2
(45) Date of Patent: Dec. 4, 2007

(54) TEMPERATURE COMPENSATED VOLTAGE REGULATOR INTEGRATED WITH MMIC'S

(75) Inventors: Atiqul Baree, Methuen, MA (US); Mikhail Shirokov, Methuen, MA (US)

(73) Assignee: Fairchild Semiconductor Corporation, South Portland, ME (US)

(*) Notice: Subject to any disclaimer, the term of this patent is extended or adjusted under 35 U.S.C. 154(b) by 174 days.

(21) Appl. No.: 11/195,886

(22) Filed: Aug. 3, 2005

(65) Prior Publication Data

US 2006/0284684 A1 Dec. 21, 2006

Related U.S. Application Data

(60) Provisional application No. 60/690,717, filed on Jun. 15, 2005.

(51) Int. Cl.
*H03F 3/04* (2006.01)
(52) U.S. Cl. .................................................. 330/296
(58) Field of Classification Search ................ 330/296; 323/316
See application file for complete search history.

(56) References Cited

U.S. PATENT DOCUMENTS

| | | | |
|---|---|---|---|
| 6,452,454 | B1 | 9/2002 | Shapiro et al. |
| 6,683,510 | B1 | 1/2004 | Padilla |
| 6,716,677 | B2 | 4/2004 | Ammar |
| 6,747,299 | B2 | 6/2004 | Mimino et al. |
| 6,748,203 | B1 | 6/2004 | Brankovic et al. |
| 6,748,212 | B2 | 6/2004 | Schmutz et al. |
| 7,057,462 | B2 * | 6/2006 | Kang et al. .................. 330/289 |
| 2002/0024390 | A1 | 2/2002 | Yamashita et al. |
| 2002/0101287 | A1 | 8/2002 | Fowler |
| 2003/0146790 | A1 | 8/2003 | Arell et al. |
| 2004/0232992 | A1 | 11/2004 | Kuriyama |

\* cited by examiner

*Primary Examiner*—Steven J. Mottola
(74) *Attorney, Agent, or Firm*—Cesari & McKenna, LLP

(57) ABSTRACT

A voltage regulator integrated with a monolithic microwave integrated circuit (MMIC) power amplifier that supplies a regulated bias current to the MMIC power amplifier that is compensated for temperature and voltage supply variations. The regulator circuit includes HBT transistors for current mirrors and a voltage regulator where a base-emitter voltage drop compensates for a similar base emitter drop in the current mirrors. The regulator circuit is designed to maintain constant the bias voltage and mirror currents with changes in Vcc and temperature. The compensated constant bias current to the MMIC power amplifier maintains uniform operating parameters for the power amplifier.

6 Claims, 3 Drawing Sheets

TEMPERATURE COMPENSATED VOLTAGE REGULATOR INTEGRATED WITH MMIC'S

CROSS REFERENCE TO RELATED APPLICATIONS

The present invention is related to and claims priority from a provisional application, Ser. No. 60/690,717, filed Jun. 15, 2005, and of common title, inventorship and ownership. This provisional application is hereby incorporated herein by reference.

BACKGROUND OF THE INVENTION

1. Field of the Invention

The present invention relates to monolithic microwave integrated circuits (MMIC's) and more particularly to the biasing of the radio frequency (RF) device of a microwave power amplifier.

2. Background Information

The recent increased demand for wireless communication fueled an increased demand for high performance RF power amplifier modules (PAM's), including RF power modules using MMIC's. These PAM's include a power amplifier chip and an external voltage regulator circuit that biases the power amplifier chip. The voltage regulator is designed to remove the PAM's sensitivity to variation in the DC supply Typically, the DC supply is a battery with substantial voltage variations during charging/discharging cycles.

Separate PAM's and regulator modules are expensive, complex, less reliable, and take up scarce space in the final assembly. However, traditional bipolar and/or CMOS circuitry used in regulator modules is not suitable for integration with the power amplifier due to operating issues, e.g. temperature.

FIG. 1 shows a typical unregulated mirror current circuit and the variation of the output current, Icc, with Vcc (the DC supply voltage) and temperature. In this circuit Icc is a mirror of Im. As can be seen from the graph, Icc increases by about ⅓ as temperature increases from about 0 to 80 degrees C., and there is a corresponding increase of Icc as the DC voltage increases. Typically, a battery will demonstrate as much as a +/−10% or more variation during a charging/discharging cycle. The result is, with temperature and battery voltage variations, Icc may nearly double.

Q1 and Q2 of FIG. 1 are current mirrors and if Im is held about constant, over temperature and Vcc variations, Icc will also be constant. The temperature variations, as known in the art, will be the temperature sensitivity of the base/emitter voltage of Q2 diminished by its relative value compared to the voltage drop across R1. FIG. 1 has no mechanism to hold Im constant with changing Vcc. Q1 and Q2, in this circuit, are GaAs HBT's (gallium arsenide hetro-junction bipolar transistors). The term HBT is defined herein to include the GaAs HBT. These transistors are very temperature and bias sensitive devices, typically affecting output signal linearity. Silicon based devices in voltage regulators are available, but they necessitate and separate additional die when used with high performance RF GaAs MMIC's. MMIC-integrated with GaAs HBT's will be more cost efficient and simplify the overall power module design and building process, while providing improved frequency performance. However, the temperature bias (or Vcc) sensitivity has limited this integrated use.

The present invention addresses these issues, making advantageous use of HBT transistors integrated in the power module. HBT devices can provide useful gain while operating at higher temperatures than traditional bipolar and/or CMOS devices. More-over, HBT devices can be made to provide useful gain at very high frequencies, e.g. up to six GHz or so.

It will be appreciated by those skilled in the art that although the following Detailed Description will proceed with reference being made to illustrative embodiments the drawings, and methods of use, the present invention is not intended to be limited to these embodiments and methods of use. Rather, the present invention is of broad scope and is intended to be defined as only set forth in the accompanying claims.

SUMMARY OF THE INVENTION

The present invention is directed to providing advantages by integrating the regulator function on a monolithic microwave (RF) integrated power amplifier chip. The regulator provides a bias current that is substantially insensitive to temperature and Vcc variations. Use of heterojunction bipolar transistors (HBT's) facilitates the ability to integrate the regulator with the RF power amplifier.

The integrated voltage regulator includes two HBT NPN transistors arranged as current mirrors of each other. Two resistors in series are functionally connected from the collector of one HBT transistor and the voltage supply source (Vcc). A regulator circuit is connected to the point between the two resistors, where, when the Vcc varies, the regulator circuit reacts in a negative feed back arrangement to maintain a constant voltage at the point between the two resistors. When the voltage at that point is constant, the current in the current mirrors is maintained constant, and so the current bias to the MMIC power amplifier is constant. The constant bias current to the power amplifier maintains the operating parameters of the MMIC power amplifier uniform.

In an example of the present invention, a third HBT transistor is used in the regulator circuit wherein its base emitter drop is arranged to compensate for temperature changes in the base emitter drops of the mirror transistors.

BRIEF DESCRIPTION OF THE DRAWINGS

The invention description below refers to the accompanying drawings, of which.

DETAILED DESCRIPTION OF AN ILLUSTRATIVE EMBODIMENT

Figure 2:
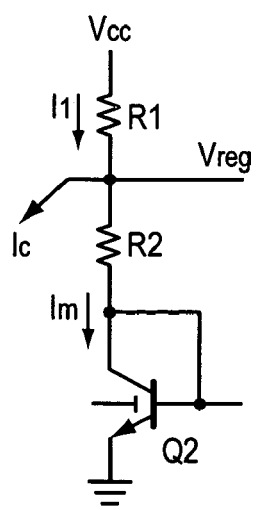
FIG. 2 is a schematic of an inventive approach to the limitations of the prior art.

FIG. 2 illustrates an approach to maintaining a constant current Im through Q2, an HBT transistor. From inspection, if Vreg is held constant, Im will be constant with respect to variation in Vcc. If Vcc varies in magnitude, the changes in current through R1 may be compensated by corresponding changes in Ic. Since I1 equals Ic+Im, if I1 changes by some value and Ic changes by the same value, then Im and Vreg would remain constant.

With respect to FIG. 2, the factors determining temperature variations of Im are the temperature sensitivity of R2 and the base-emitter drop of Q2. Assuming R2 remains constant over the temperature changes, the base-emitter drop substantially determines the temperature sensitivity of Im. Typically, with increasing temperature, the Vbe decreases and so the voltage across R2 would increase, increasing the current Im and hence any mirror current that was a mirror of Im (like Icc in FIG. 1).

Figure 3:
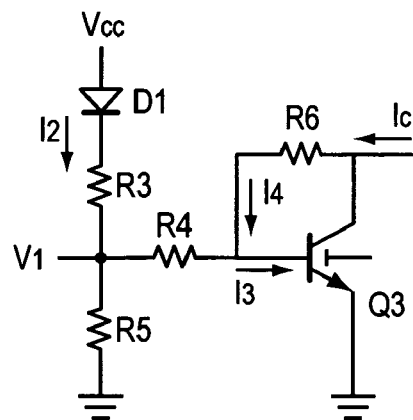
FIG. 3 is a circuit schematic of one embodiment of the present invention.

FIG. 3 is an embodiment of the present invention. In this circuit Ic is the same Ic of FIG. 2, so FIGS. 2 and 3 are described together. Ic varies linearly with Vcc and the temperature variations of the Vbe of Q2 will act to further increase Ic and Im. But, with respect to FIG. 3, the temperature variations of Vbe of Q3 will be countered by the lower drop across D1 with temperature. The result will tend to maintain I3 steady.

As mentioned above, the invention includes use of heterojunction bipolar transistors (HBT) Q2, Q3, Q4, etc., that are suitable for integrating with the RF device of a power amplifier circuits. The HBT devices are well suited for combining, which eliminates the need for a separate regulated module and a separate connection. Note that the Vbe of such transistors is typically about 1.3 V.

Referring to FIG. 3, when Vcc increases, for example, the voltage at V1 increases, the current I3 into the base of Q3 increases and hence Ic increases. Note that in the prior art of FIG. 1, if Vcc increases Im and Icc increase. In the inventive circuit of FIG. 3, if Vcc increases, Ic increases to absorb the increased current through R1, thereby counter-acting the increase in Vcc and thereby tending to hold Im and Vreg constant. From inspection of the circuit of FIG. 3, some of the base current of Q3 travels through R6, referenced as I4. This feedback link is a negative link that also tends to increase linearly Ic with increasing Vcc, thus maintaining Im and Vreg substantially constant. That is, initially Vreg increases as Vcc increases, I2 and I4 in turn increase turning on Q3 more heavily, that, in turn, increases Ic and decreases Vreg.

As temperature increases, Vbe of Q2 decreases and Im would increase. However, the Vbe of Q3 correspondingly decreases and the base current of Q3 increases. This increase drives Vreg lower and thereby tends to keep Im (and thus Icc) constant.

Diode D1 and resistors R3, R4, and R5 in FIG. 3 are used to provide flexibility in the driving of Q3 to match the variations anticipated and encountered in practical circuit implementations. Indeed, R5 and R6 may be eliminated in same cases.

Figure 4:
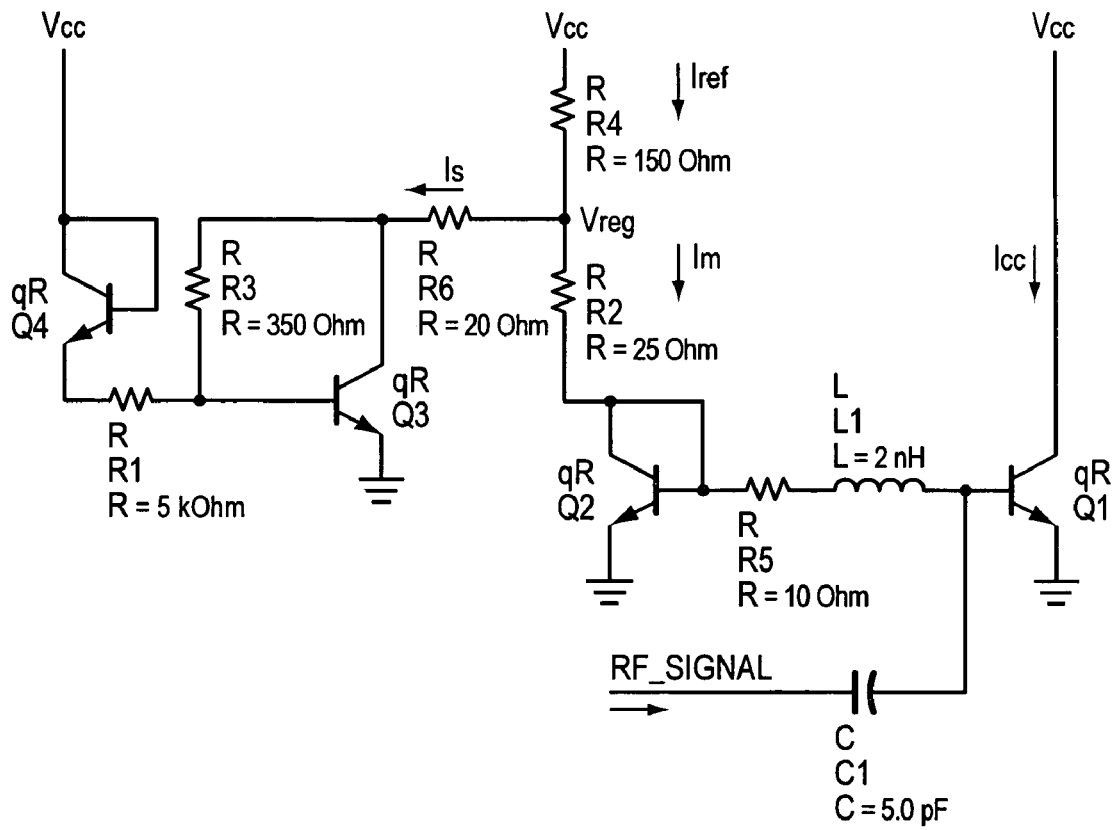
FIG. 4 is a circuit schematic of another embodiment of the present invention.

FIG. 4 shows an embodiment of the present invention. Here, the diode D1 of FIG. 3 is replaced by the diode connected transistor Q4. The sub-circuit comprised of Q3, Q4, R1, R2 and R6 regulate the voltage at Vreg. R1 and Q1 provide a reference bias voltage for Q3. R3 linearizes Q3's response. R6 provides a slope control of the Icc temperature response. R4 sets a quiescent Icc value based on the Vcc selected. R2 may be used as it helps limit the effects of the regulated sub-circuit. R1 and L5 are part of the RF choking and base current limiting circuit of Q1.

Figure 1:
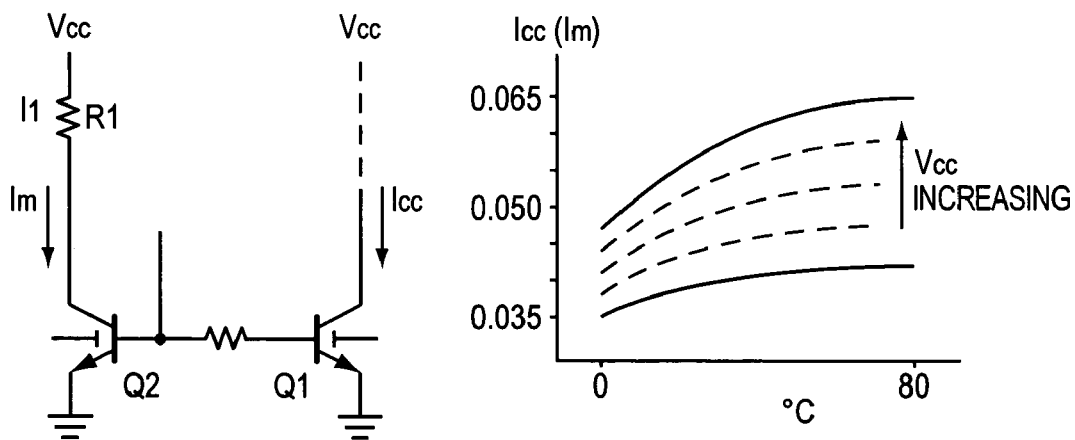
FIG. 1 is a circuit schematic and graph of a prior art current mirror.

In FIG. 1, Vreg varies 10 mv as Vcc varies from 3.0 to 3.6 V. With the FIG. 4 compensating circuit 40 for Ic, the variation of Vreg is about 2 mv. The regulator circuit in FIG. 4 does not necessarily keep Vreg constant, but Vreg is controlled to effect the desired Icc. For example, it may be desirable to produce an Icc v Temperature slope on some stages of an RF MMIC, while maintaining Icc relatively constant with temperature on other stages. However, producing a very tight variation of Icc with respect to Vcc variations, in almost all cases, is beneficial.

Figure 5:
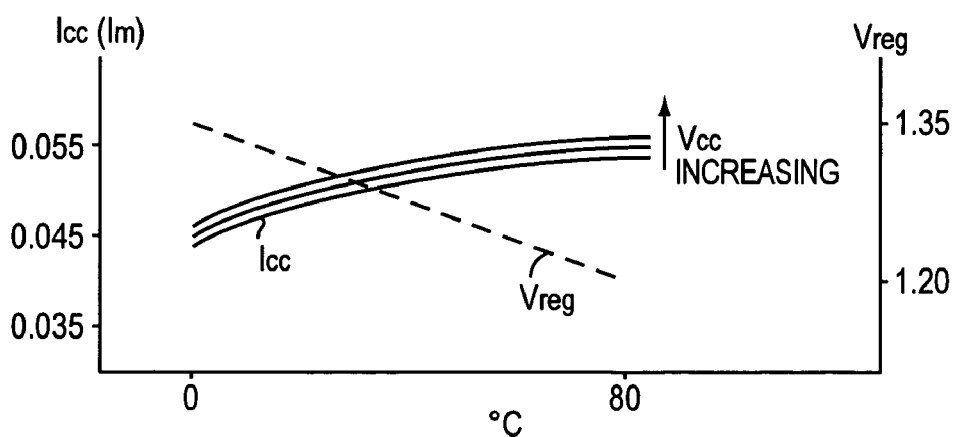
FIG. 5 is a graph of Icc showing temperature and Vcc sensitivities.

Compare FIG. 1 to FIG. 5. In FIG. 5 Vreg varies as temperature rises, this variation compensates for the temperature variation of the Vbe of Q2 thereby working to hold Im and thus Icc substantially constant. Here Icc varies by about 10 mA in FIG. 5 compared to about 30 mA in the graph of FIG. 1.

Figure 6:
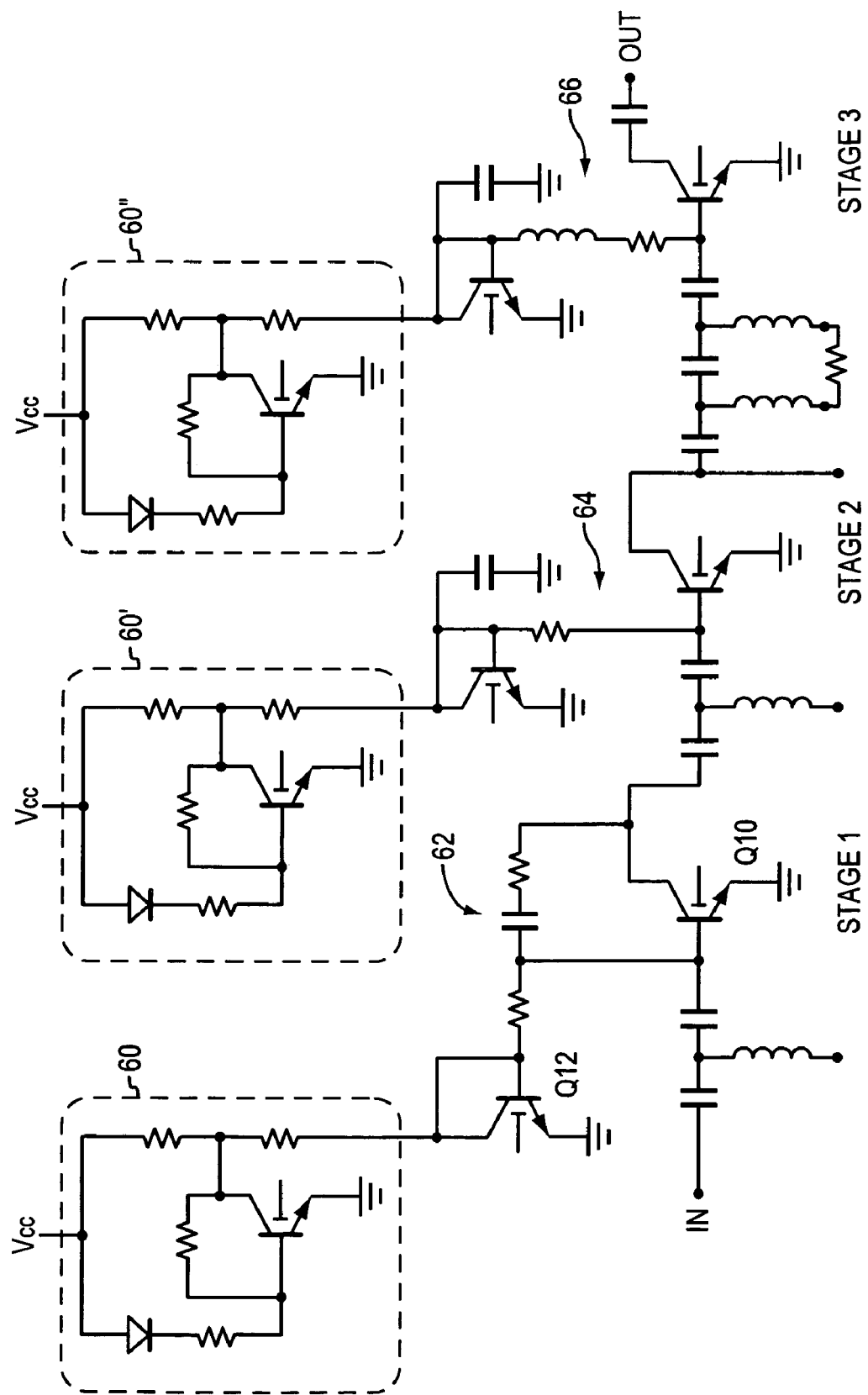
FIG. 6 is a schematic of a multistage RF power amplifier.

FIG. 6 is a representative circuit block diagram of a three stage power amplifier amplifier. In the first stage, an IN signal is fed through capacitors to the base of Q10. Q10 is biased by the mirror transistor Q12 and the voltage regulator circuit 60 as described above. The second and third stages are biased by regulators, 60' and 60", respectively. The regulator for stage 1 is tuned by components 62, stage 2 by 64, and stage 3 by 66. Each is tuned differently because of the different bias currents required for each stage of the power amplifier and the different HBT transistor sizes depending on the particular design.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A voltage regulator for a monolithic microwave integrated power amplifier circuit comprising:
a first HBT transistor having a first collector current;
a second HBT transistor arranged as a current mirror with the first transistor, where the collector current of the second HBT transistor mirrors the first collector current;
first and second resistors disposed in series between the collector of the first HBT transistor and a voltage source, the first and second resistors providing a path for the first collector current, the point electrically between the first and second resistors defining a first voltage; and
a third HBT transistor with its collector functionally connected to the first voltage point and a third resistor functionally connected from the collector to the base of the third HBT transistor, wherein the third HBT transistor conducts more or less current away from the first voltage point when the voltage source rises or falls, respectively, wherein the voltage at the first voltage point remains substantially constant.

2. The voltage regulator of claim 1 further comprising:
a fourth resistor-disposed between the base of the third transistor and the voltage source
wherein as the voltage source increases in value the current drive to the base of the third transistor increases;
wherein the third HBT transistor sinks more current from the first voltage point, and when the voltage source decreases in value the current drive to the base of the third transistor decreases
wherein the third HBT transistor sinks less current from the first voltage point;

further, wherein the temperature sensitivity of the base emitter voltage drop across the third HBT transistor compensates for the temperature sensitivity of the base emitter voltage drop across the first HBT transistor; and wherein the collector current of the first HBT transistor remains substantially constant with variations in voltage source value changes and remains constant or controlled with temperature changes.

3. The voltage regulator of claim 1 wherein the regulator and the monolithic circuit power amplifier are integrated on the same chip.

4. The voltage regulator of claim 1 wherein the monolithic microwave integrated circuit is a power amplifier.

5. The voltage regulator of claim 2 further comprising a diode disposed between the base of the third HBT transistor and the voltage source.

6. A multistage monolithic power amplifier circuit comprising:

a voltage regulator circuit as defined in claim 1 arranged to supply a regulated bias current to each of the stages of the multistage power amplifier circuit, wherein each of the voltage regulator circuits is tuned differently depending on the bias current requirements of each stage.

* * * * *